United States Patent [19]

Hidaka et al.

[11] Patent Number: 5,403,412
[45] Date of Patent: Apr. 4, 1995

[54] STICKING APPARATUS AND STICKING METHOD

[75] Inventors: Masao Hidaka, Kasuga; Hiroaki Sakai, Fukuoka, both of Japan

[73] Assignee: Matsushita Electric Industrial Co., Ltd., Osaka, Japan

[21] Appl. No.: 151,202

[22] Filed: Nov. 12, 1993

[30] Foreign Application Priority Data

Nov. 17, 1992 [JP] Japan .................. 4-306708

[51] Int. Cl.⁶ ............................ B32B 31/00
[52] U.S. Cl. ...................... 156/64; 156/249; 156/344; 156/350; 156/363; 156/584
[58] Field of Search ............... 156/64, 247, 249, 344, 156/350, 358, 362, 363, 552, 583.1, 584

[56] References Cited

U.S. PATENT DOCUMENTS

| | | |
|---|---|---|
| 4,732,642 | 3/1988 | Ametani .................. 156/344 X |
| 5,009,735 | 4/1991 | Ametani et al. .......... 156/249 X |
| 5,043,032 | 8/1991 | Hunter et al. ............ 156/64 |
| 5,191,693 | 3/1993 | Umetsu .................. 156/350 X |

Primary Examiner—David A. Simmons
Assistant Examiner—Paul M. Rivard
Attorney, Agent, or Firm—Stevens, Davis, Miller & Mosher

[57] ABSTRACT

A electrically conductive sheet stuck onto a medium is picked up by a camera so as to detect the sticking position of the electrically conductive sheet on the medium, and the sticking condition of the electrically conductive sheet is compared with a predetermined pattern so as to determine whether the sticking condition of the electrically conductive sheet is satisfactory or not. That is, the check of the sticking condition of the electrically conductive sheet is automated. Further, a position where the sticking of the electrically conductive sheet is inferior is indexed in accordance with the result of the check, and the retry operation for sticking again the electrically conductive sheet can be automatically made.

8 Claims, 11 Drawing Sheets

CHECK DATA

| STICKING POSITION | RESULT OF CHECK |
|---|---|
| P1 | SATISFACTORY STICKING CONDITION |
| P2 | SATISFACTORY STICKING CONDITION |
| . | |
| . | |
| . | |
| P5 | UNSATISFACTORY STICKING CONDITION |
| . | |
| . | |
| . | |
| P8 | UNSATISFACTORY PEEL-OFF CONDITION |
| . | |
| . | |
| . | |
| P15 | UNSATISFACTORY PEEL-OFF CONDITION |
| P16 | SATISFACTORY STICKING CONDITION |

FIG. 12

STICKING APPARATUS AND STICKING METHOD

BACKGROUND OF THE INVENTION

The present invention relates to a sticking apparatus for sticking an electrically conductive sheet onto a display panel, and a method thereof.

These years, electronic parts manufactured by a TAB (Tape Automated Bonding) process have been prosperously used for driver ICs for a display panel such as a liquid crystal panel, and further, it has been known to use a tape-like anisotropic electrically conductive sheet for sticking a driver IC onto a display panel.

The above-mentioned electrically conductive sheet is made of epoxy group synthetic resin or the like in which electrically conductive metal particles are mingled. Further, this sheet is adhesive so that it can be stuck onto a display panel, and accordingly, it is available in such a condition that a non-adhesive protecting sheet is applied onto the upper surface of the adhesive tape in order to protect the adhesive tape. Further, the electrically conductive sheet is stuck onto the display panel in this condition, and thereafter, the protecting sheet is peeled off.

In this arrangement, in a conventional method of sticking the electrically conductive sheet, a worker has been visually checked whether the sticking of the electrically conductive sheet is satisfactory after it is applied onto the display panel. The visual check of the sticking condition has offered a serious problem of excessive working time and labor.

SUMMARY OF THE INVENTION

The present invention is devised in view of the above-mentioned problem, and accordingly, one object of the present invention is to provide a sticking apparatus for and a sticking method of sticking an electrically conductive sheet onto a panel, in which the sticking is rapidly made while the sticking is checked.

To the end, according to the present invention, there is provided a sticking apparatus comprising a supply means for supplying an adhesive sheet composed of a lower sheet which is electrically conductive and adhesive, and an upper sheet which is applied onto the top side of the lower sheet so as to protect the lower sheet, a memory means for storing therein data concerning a sticking position on a medium, and a sticking means for sticking the adhesive sheet on a medium in accordance with the sticking position data stored in the memory means, a peel-off means for peeling off the upper sheet from the adhesive sheet stuck on the medium by the sticking means, a determining means for determining the sticking condition of the adhesive sheet stuck on the medium, and for detecting the sticking position of the adhesive sheet, and a control means for controlling the operation of the sticking means and/or the peel-off means in accordance with the result of the determination by the determining means.

PREFERRED EMBODIMENT OF THE PRESENT INVENTION

Next, explanation will be made of an embodiment of the present invention with reference to the drawings.

Figure 1:
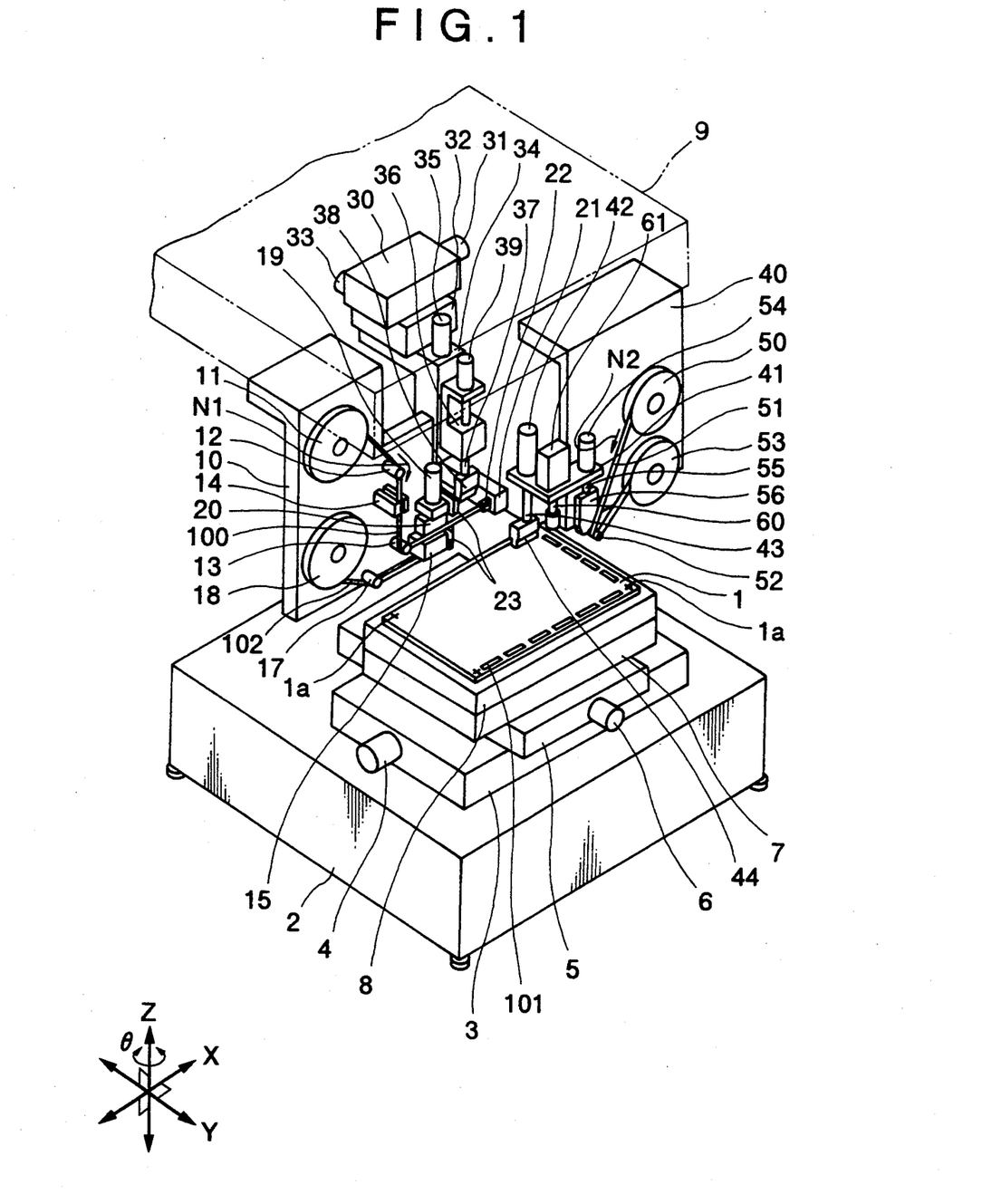
FIG. 1 is a perspective view illustrating a sticking apparatus in an embodiment of the present invention.

FIG. 1 is a perspective view illustrating a sticking apparatus for an electrically conductive sheet in the embodiment of the present invention.

At first, referring to this figure, a positioning means for positioning a display panel 1 will hereinbelow be explained. In this figure, there are shown a base 1, an X-axial table 3 which is laid on the base 1 and which can be moved under the drive of an X-axial motor 4 in the X-axial direction in a horizontal plane, a Y-axial table 5 which is laid on the X-axial table 3 and which can be moved under the drive of a Y-axial motor 6 in the Y-axial direction in a horizontal plane, and a turn table 7 laid on the Y-axial table 5, for angularly turning a holder for holding the display panel 1 around a vertical axis (which is turned by a turn motor that is not shown). That is, when the X-axial motor 4, Y-axial motor 6 and the turn motor are driven, the display panel 1 is moved in the X-axial, Y-axial and angular directions, relative to electrically conductive sheet supply means A, a sticking means B, a peel-off means C and a determining means D which will be herein below explained in detail. Further, a top plate 9 is laid above the base 1.

Figure 2:
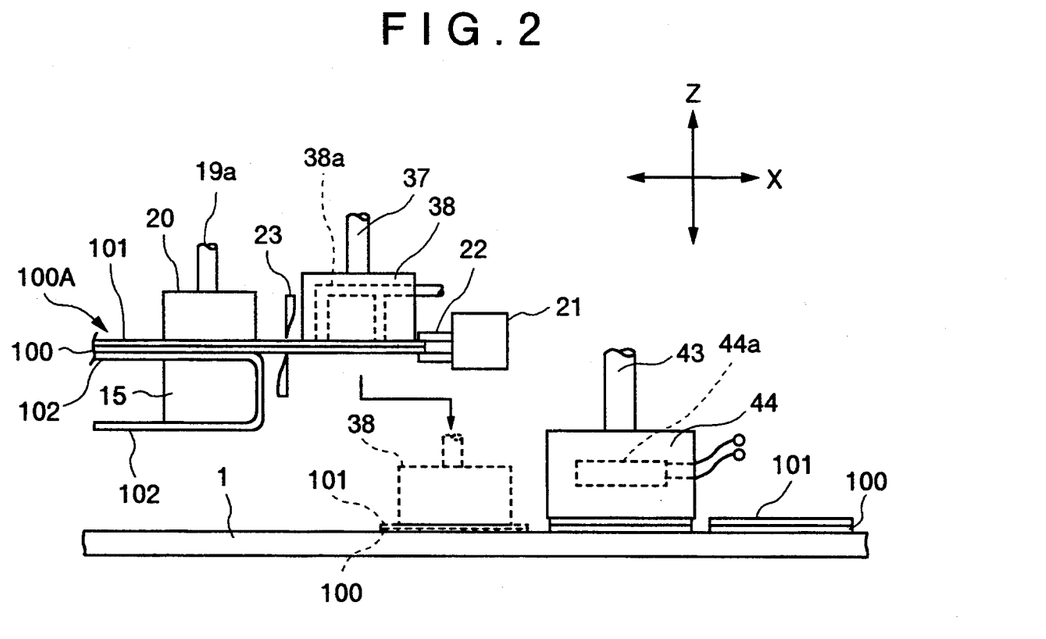
FIG. 2 is an explanatory view showing the operation of the sticking apparatus shown in FIG. 1.

Next, the electrically conductive sheet supply means A will be hereinbelow explained. A first support plate 10 fixed to the lower surface of the top plate 9 so as to extend in the X-axial direction, and a supply reel 11 is journalled to the first support plate 10 so as to be rotated around a horizontally extending center axis, on which a tape-like electrically conductive sheet 100 on which protecting sheets 101, 102 are applied as shown in the upper left part of FIG. 2, is wound. In this arrangement, the electrically conductive sheet 100 is wound on the supply reel 11 in such a condition that it has a three-layer structure in which the electrically conductive sheet 100 is held between the protecting sheets 101, 102 applied over the upper and lower surfaces thereof (the sheet having such a three layer structure will be hereinbelow denoted as "three-layer sheet").

The three layer sheet 100 passes through a sensor 14 for detecting exhaustion of the three layer sheet 100, being guided by guide rollers 12, 13, and the lower protecting sheet 102 is peeled off at the right side end face of a stationary block 15 provided to the first support plate 10. The lower protecting sheet 102 is turned around the stationary block 15 by an angle of 180 deg. and is wound onto a take-up reel 18 after it is guided by a guide roller 17.

A cylinder 19 having a rod 19a adapted to be vertically extended therefrom and retracted thereinto is fixed to the first support plate 10. Referring to FIG. 2, the lower end part of the rod 19a is coupled to a press block 20 for pressing the three layer sheet 100A against the upper surface of the stationary block 15 facing thereto. A draw-out part 21 is moved in the X-axial direction by a shifting means which is not shown, and has chucking pawls 22 for chucking the leading end parts of the upper protecting sheet 101 and the electrically conductive sheet 100 so as to draw out these sheets by a predetermined length. A pair of cutter blades 23 are moved in the Z-axial direction so as to cut off, at a predetermined position, the upper protecting sheet 101 and the electrically conductive sheet 100 which have been drawn out by the draw-out part 21. Thus, the sheet supply means A can feed the electrically conductive sheet 100 having a predetermined length to the sticking means B which will be explained hereinbelow, with the upper protecting sheet 101 being attached thereover.

Next, referring again to FIG. 1, the sticking means B will be explained. A base table 30 is provided at the lower surface of the top plate 9, and an X-axial table 32 is provided at the lower surface of the base table 30 and is adapted to be moved in the X-axial direction by means of an X-axial motor 31. Further, an inverted L-like shape Y-axial table 34 provided at the lower surface of the X-axial table 32 and is adapted to be moved in the Y-axial direction by means of a Y-axial motor 33, and an elevating block 36 is provided at one side part of the Y-axial table 34 and is adapted to ascend and descend in the Z-axial direction by means of a Z-axial motor 35. A turn motor 39 is fixed to the upper part of the elevating block 36, and has its output shaft to which a rod 37 is journalled. The lower end part of the rod 37 is coupled to a suction head 38 adapted to make contact with the upper protecting sheet 101, for sucking up the electrically conductive sheet 100 under vacuum. The turn motor 39 is adapted to turn the suction head 38 around its vertical center axis. As shown in FIG. 2, a plurality of suction holes 38a are formed at the lower surface of the suction head 38, and are communicated with a suction means which is not shown.

Thus, the upper protecting sheet 101 and the electrically conductive sheet 100 are drawn out by the draw-out part 21 of the sheet supply means A, then the suction head 38 is set above the upper protecting sheet 101 by driving the X-axial motor 31, the Y-axial motor 33 and the Z-axial motor 35, and the upper protecting sheet 101 is sucked up by driving the suction means, as indicated by the solid line shown in the left part of FIG. 2 while the cutters 23 in the sheet supply means A are actuated so that the electrically conductive sheet 100 with the upper protecting sheet 101 applied on the upper surface thereof can be delivered, having a predetermined length, to the suction head 38.

Next, as shown by the dot line in FIG. 2, the electrically conductive sheet 100 which have been delivered to the suction head 38 with the upper protecting sheet 101 being applied thereon is shifted onto the display panel 1 by driving the X-axial motor 31, the Y-axial motor 33 and the Z-axial motor 35.

Further, referring to FIG. 1, a second support plate 40 which is fixed to the lower surface of the top plate 9 is fixed at one side part thereof with a horizontally extending auxiliary support plate 41. Further, a press head 44 for temporarily press-sticking the electrically conductive sheet 100 having been shifted onto the display panel 1, is coupled to the lower end part of a rod 43 extending downward from the lower end part of a cylinder 42 which is fixed to the auxiliary support plate 41 so as to vertically extend.

A heater 44a is incorporated in the press head 44, as shown in FIG. 2, and is connected to a power supply means which is not shown. Accordingly, the electrically conductive sheet 100 having been shifted onto the display panel 1 is heated and temporarily stuck under pressure by means of the press head 44 so as to cause the electrically conductive sheet 100 to exhibit a sufficient adhesive force.

Figure 3:
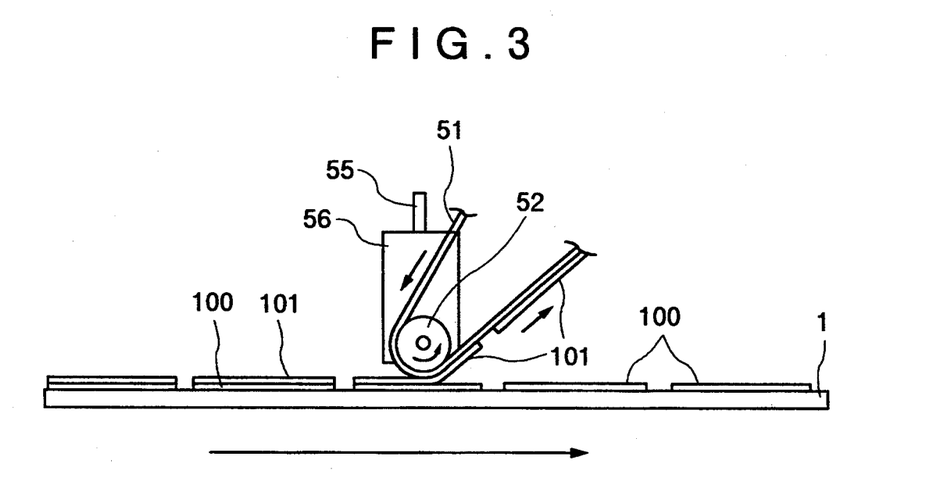
FIG. 3 is an explanatory view showing the operation of the sticking apparatus shown in FIG. 1.

Next, explanation will be made of the peel-off means C for peeling off the upper protecting sheet 101 from the upper side of the electrically conductive sheet 100 which has been stuck onto the display panel by means of the sticking means B so as to expose the electrically conductive sheet 100, with reference to FIGS. 1 and 3.

Referring to FIG. 1, a supply reel 50 is attached to the second support plate 40 so as to be rotated about a horizontal axis, and is wound thereon with an adhesive tape 51, and a take-up reel 53 is attached to the second support plate 40 so as to be rotated, similar to the supply reel 50, and is adapted to wind up thereon the adhesive tape 50 which has been paid out in the direction of the arrow N2 from the supply reel 50 and is turned back by a pressing roller 52. A cylinder 54 is fixed to the auxiliary support plate 41 so as to be vertically extended, and has a rod 55 which can be vertically extended from and retracted into the cylinder 50. The rod 55 is coupled to the upper part of a plate 56 which is rotatably journalled to the pressing roller 52.

Thus, the pressing roller 52 is set above the upper protecting sheet 101 to be peeled off by driving the X-axial motor 4, the Y-axial motor 6 and the turn table 7 and by driving the cylinder 54, then the adhesive tape 51 made into peripheral contact with the pressing roller 52 is brought into press-contact with the upper protecting sheet 101, and the display panel 1 is moved in the X-axial direction, relative to the pressing roller 52 while the adhesive tape 51 is fed from the supply reel 50 to the take-up reel 53 so that the upper protecting sheet 101 is peeled off.

Since the adhesive force between the upper protecting sheet 101 and the adhesive tape 51 is greater than that between the electrically conductive sheet 100 and the upper protecting sheet 101, and further since the adhesive force between the electrically conductive sheet 100 and the display panel 1 is greater than that between the upper protecting sheet 101 and the adhesive tape 51, only the upper protecting sheet 101 is stuck to the adhesive tape 51 and is retrieved onto the take-up reel 53, and the electrically conductive sheet 100 is left being stuck on the display panel 1.

Next, the determining means D will be explained. Referring to FIG. 1, a camera 61 is attached to the auxiliary support plate 41, facing downward, and a lens barrel 60 incorporating a light source is attached to the lower part of the cameral 61. This camera 60 is connected to a determining part 62 which will be described hereinbelow. Further, the camera 61 observes positioning marks 1a so as to detect the position of the display panel 1 held on the holder 8, and determines a sticking condition of the electrically conductive sheet 100 stuck to the display panel 1.

It is noted that the sheet supply means A, the sticking means B and the peel-off means C are arranged to be all moved in the X-axial direction. Meanwhile, the electrically conductive sheet 100 is usually stuck onto the display panel 1, often not only in the X-axial direction but in the Y-axial direction. Accordingly, the turn motor is driven to rotate the turn table 7 so as to turn the display panel 1 by an angle of 90 deg. or 270 deg. in order to cope with such a case. Of course, the first support plate 10 can be laid in the X-axial direction while the second support plate 40 can be laid in the Y-axial direction, or other various measures can be also taken for this purpose.

Figure 4:
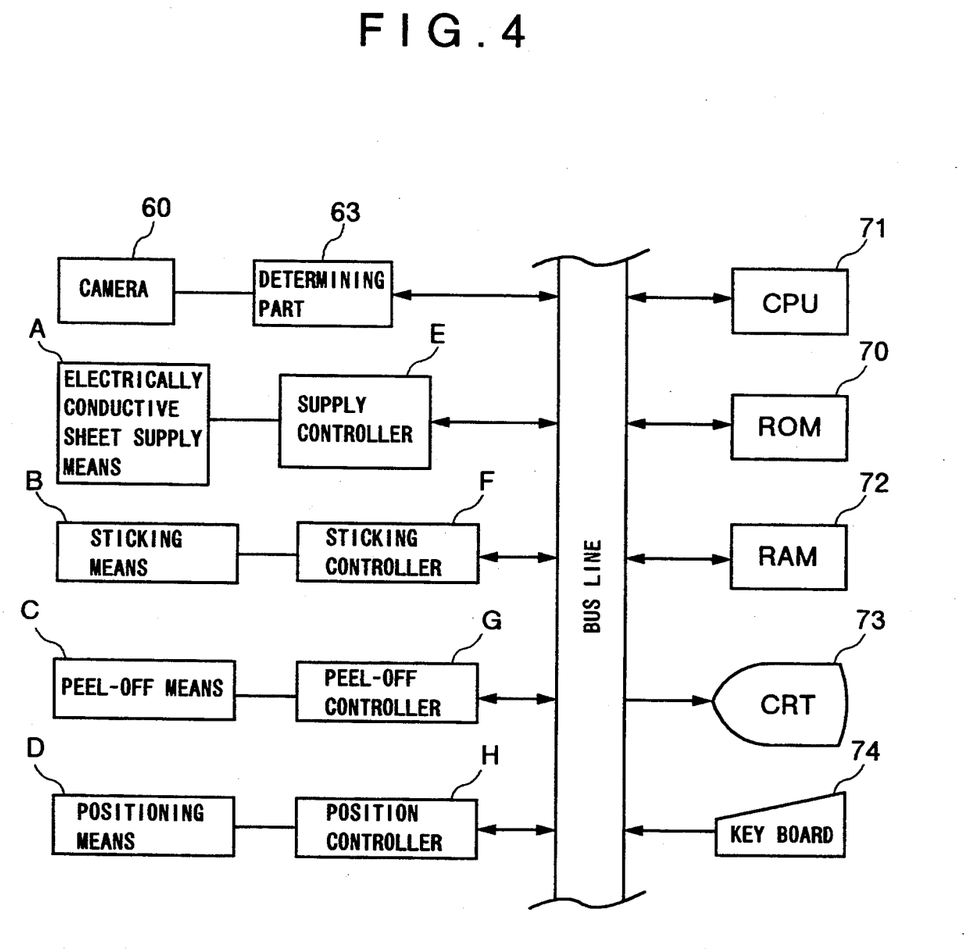
FIG. 4 is a block diagram showing the sticking apparatus shown in FIG. 1.

FIG. 4 is a block diagram showing the function of the sticking means B in this embodiment. The determining means 63 carries out a pattern matching process or the like for an image signal transmitted from the camera 61, and delivers the result of the process.

Figure 12:
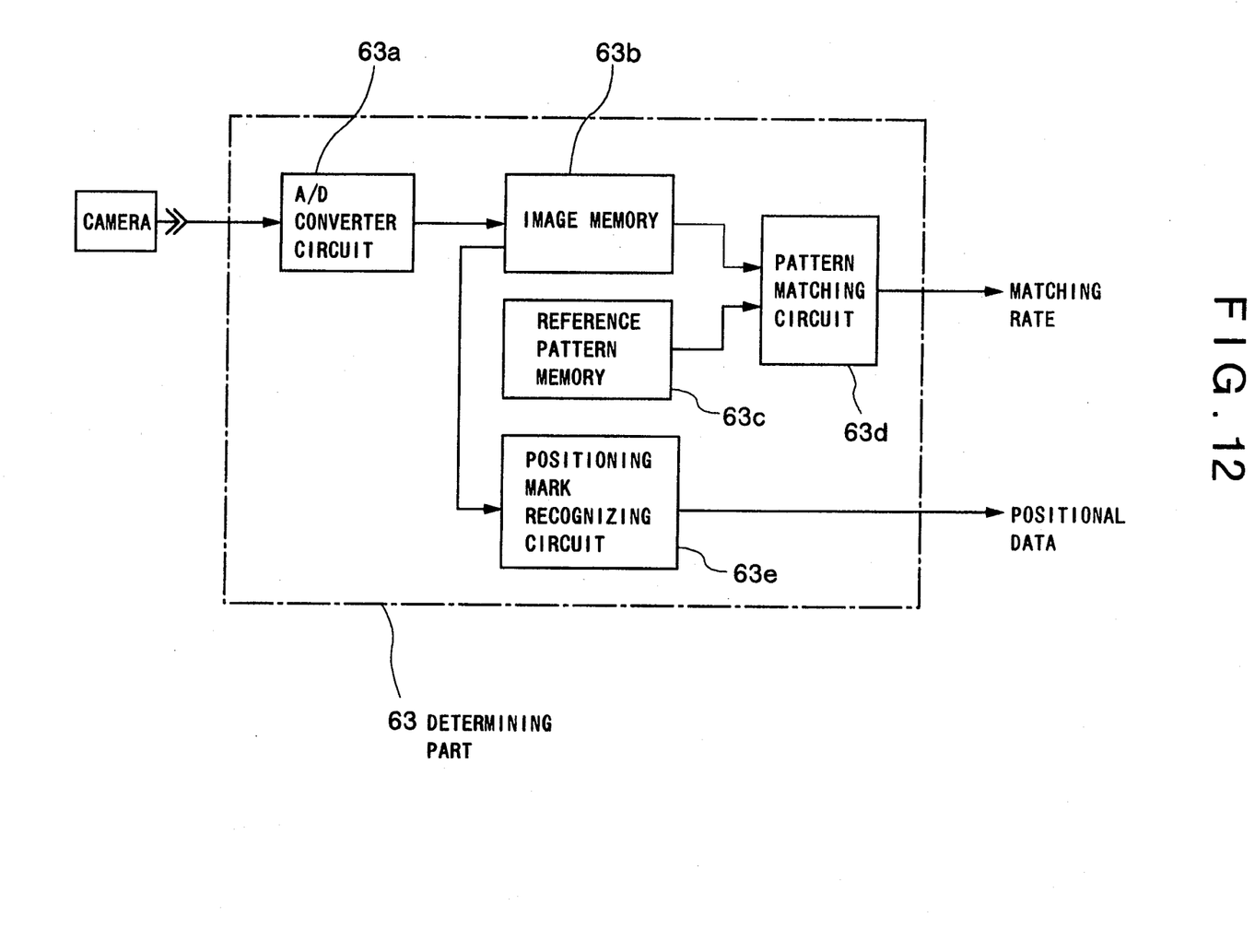
FIG. 12 is a block diagram illustrating a determining part used in the embodiment of the present invention.

Referring to FIG. 12 which is a block diagram showing the function of the determining part 63, an A/D converter circuit 63a digitalizes the image signal transmitted from the camera 61, and an image memory 63b stores therein the thus digitalized image signal as image data. A reference pattern memory 63c stores a reference pattern which is adapted to be used for checking the sticking condition of the electrically conductive sheet, and which will be explained later, and a patten matching circuit 63d compares an image data stored in the image memory 63b with the reference pattern stored in the reference pattern memory 63c, and calculates and delivers a matching rate (the degree of coincidence) therebetween. A positioning mark recognizing circuit 63e recognizes the positions of the positioning marks 1a on the display panel and delivers positional data.

In order to detect the positions of the positioning marks 1a, the camera 61 picks up the positioning marks 1a and delivers the images thereof into the image memory 63, and the positioning mark recognizing circuit 63e detects the positions of the positioning marks 1a.

In order to check the sticking condition of the electrically conductive sheet 100, the camera 61 picks up the electrically conductive sheet 100 stuck on the display panel 1, and delivers the image data thereof to the pattern matching circuit 63 which therefore calculates a matching rate in comparison with the reference pattern.

Figure 5:
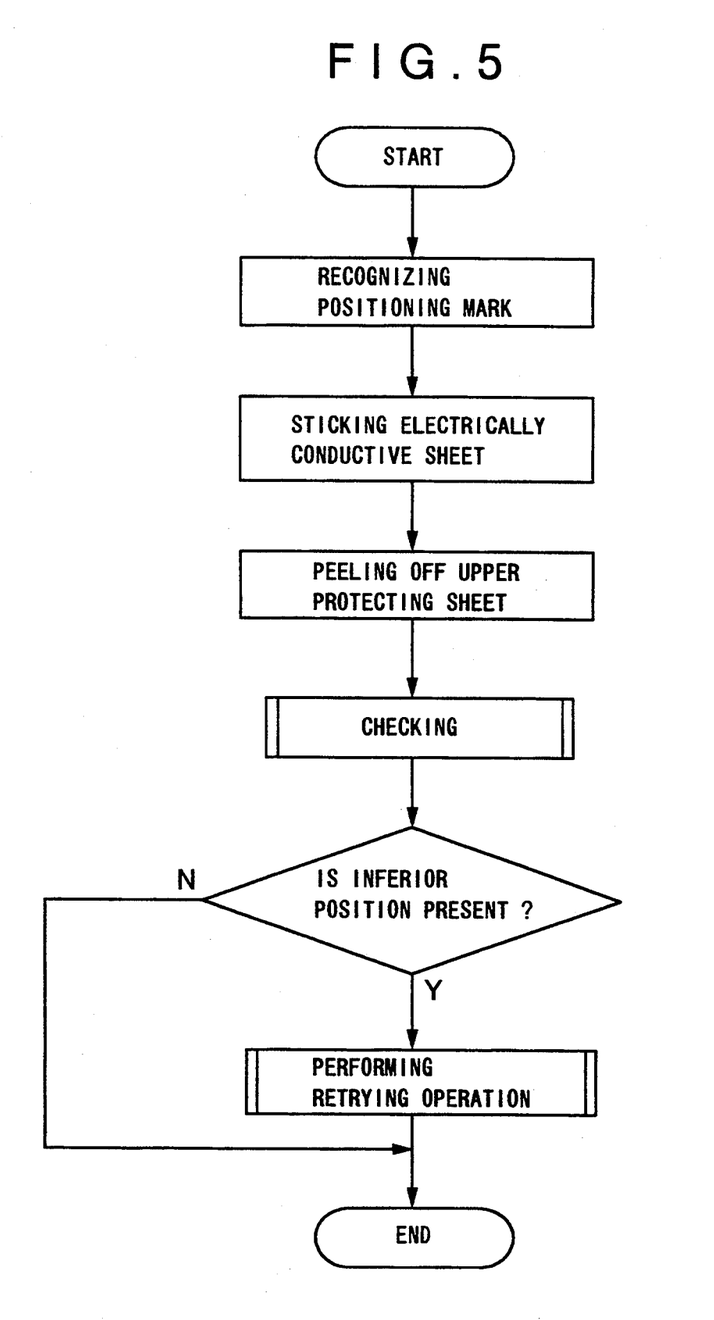
FIG. 5 is a flow chart showing the operation of the sticking apparatus shown in FIG. 1.
Figure 6:
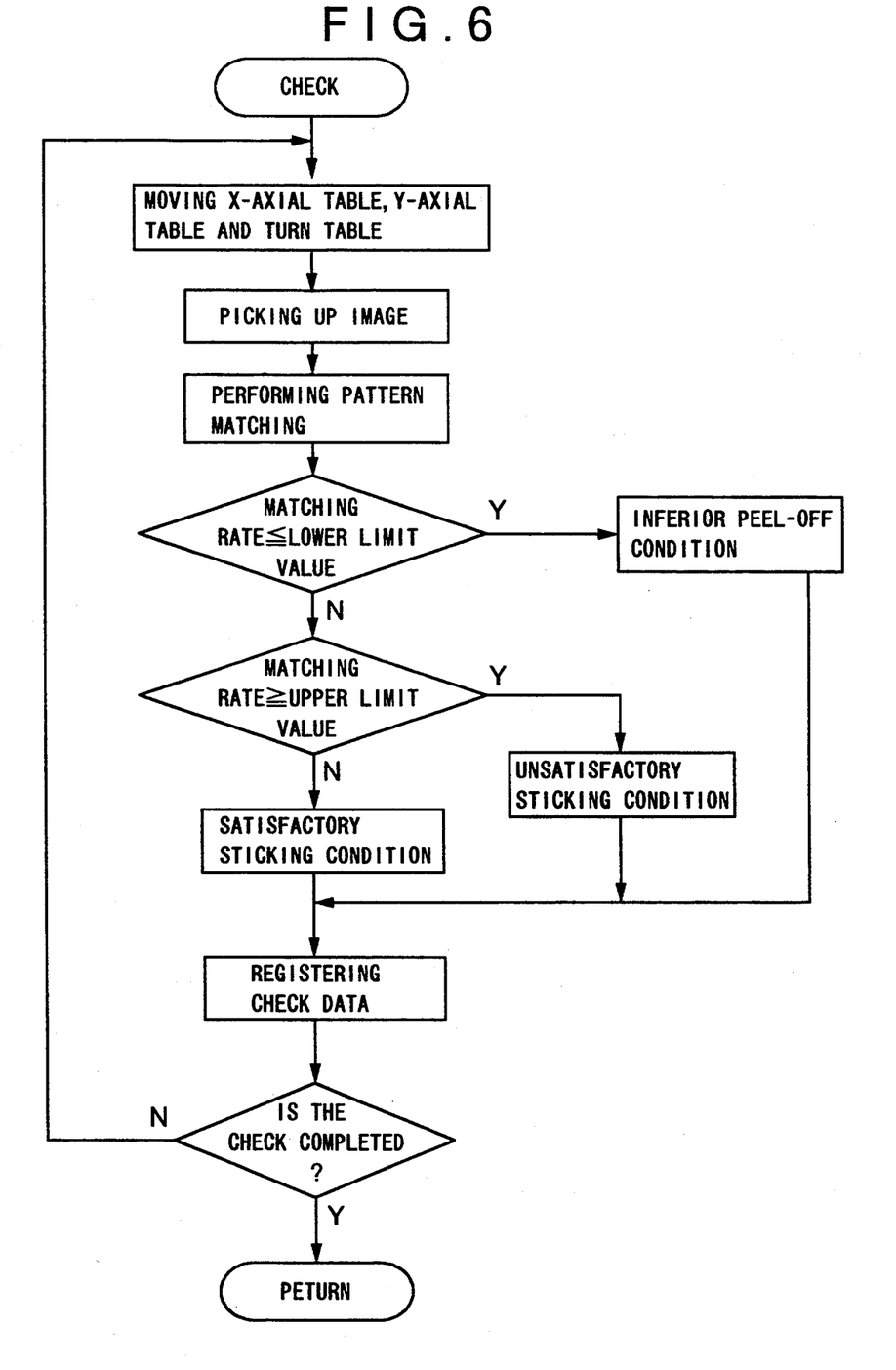
FIG. 6 is a flow chart showing the operation of the sticking apparatus shown in FIG. 1.
Figure 7:
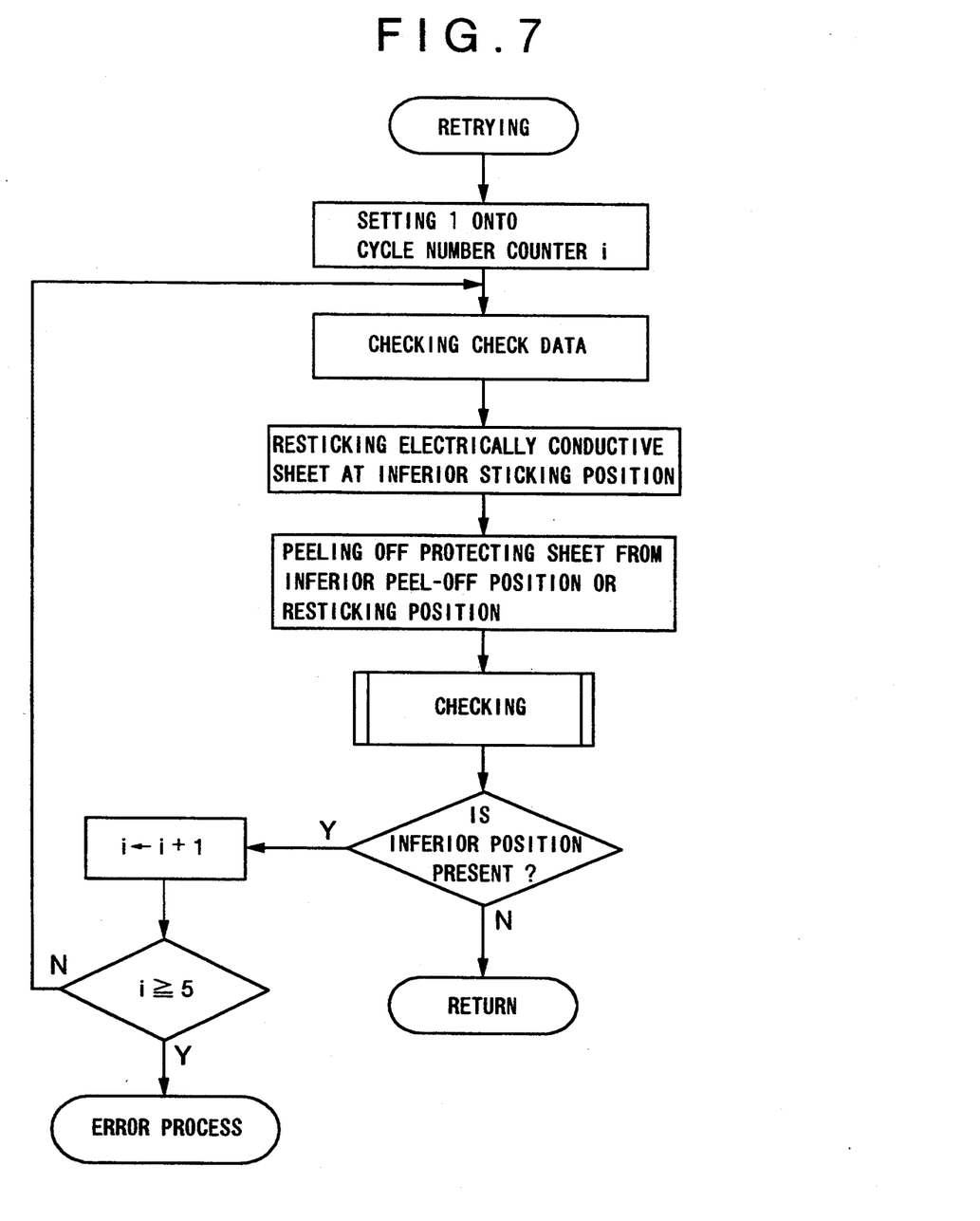
FIG. 7 is a flow chart showing the operation of the sticking apparatus shown in FIG. 1.

Referring again to FIG. 4, a ROM 70 stores a control program given by a flow chart shown in FIGS. 5 to 7, and a CPU carries out the program stored in the ROM 70, and control the several means in the sticking apparatus, that is, it serves as a checking means for determining whether the sticking condition of the electrically conductive sheet 100 is satisfactory or not.

A RAM 72 has areas for storing various data, such as an area for storing inspection data and an area storing data relating to the sticking position, and a CRT 72 displays thereon an error indication, an operating condition or the like which is useful for the user. The user can input necessary data through a keyboard.

Further, the above-mentioned electrically conductive sheet supply means A, the sticking means B, the peel-off means C and the positioning means D are controlled respectively by a supply controller E, a sticking controller F, a peel-off controller G and a position controller H which are connected to a bus line.

Next, explanation will be made of a sticking method using the sticking apparatus in the above-mentioned embodiment with reference to FIGS. 1, 5 to 7, and 9. Referring to FIG. 5 which shows a flow chart relating to the sticking operation for the electrically conductive sheet, the two positions of the positioning marks 1a in the diagonally opposite corner parts of the display panel 1 shown in FIG. 1 are picked up by the camera 61 so as to confirm the position of the display panel 1 (step 1).

Figure 9:
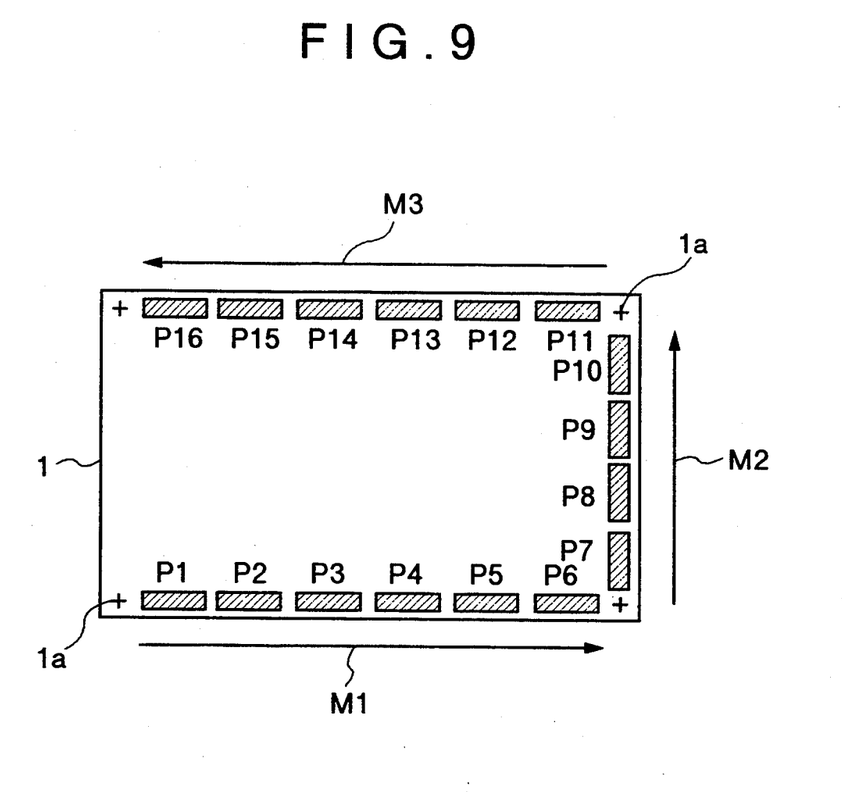
FIG. 9 is a plan view illustrating a display panel used for explanation of the embodiment of the present invention shown in FIG. 1.

Referring to FIG. 9, electrically conductive sheets are stuck to sticking positions P1 to P16 on the display panel 1 in that numbering order thereof in the directions of the arrows M1, M2, M3. It is noted that the sticking direction is turned by an angle of 90 deg. between the sticking positions P6 and P7, and between the sticking positions P10 and P11, and this can be made by rotating the turn table 7 so as to turn the display panel in order to allow each of the sticking directions M1, M2, M3 to coincide with the X-axial direction, as mentioned above.

Next, the sticking means B is driven so as to stick the upper protecting sheets 101 and the electrically conductive sheets 100 on the display panel 1 at the sticking positions P1, P2 . . . in that order (step 2).

Next, by driving the peel-off means C, the upper protecting sheets 101 are peeled off from the electrically conductive sheets 100 which have been stuck on the sticking positions P1 to P16 (step 3). This operation will be explained with reference to FIG. 9. At first, the recognition mark 1a on one side the sticking position P6 is positioned right below the pressing roller 52 of the peel-off means C by means of the X-axial table 3 and the Y-axial table 5. Next, the cylinder 42 is operated so as to lower the pressing roller 52 in order to press the adhesive surface of the adhesive tape 51 making peripherally contact with the outer periphery of the pressing roller 52 against the display panel 1.

In this condition, when the display panel 1 is moved to the left of FIG. 9, the protecting sheets 101 at the positions P6, P5, . . . P1 are stuck to the adhesive tape 51, and are peeled off, one by one, from the electrically conductive sheets 100. After the peels-off of the protecting sheets 101 at the positions P6, . . . P1 is completed in this way, the protecting sheets at the sticking positions P11, . . . P16, P7, . . . P10 are peeled off in a similar manner. In order to peel off the protecting sheets 101 at the sticking positions P7, . . . P10, the direction of the display panel 1 is turned by an angle of 90 deg. by means of the turn table 7 so as to make the direction of the line-up of the sticking positions P7, . . . P10 coincident with the direction of rolling advance of the pressing roller 52.

Next, the peel-off conditions of the protecting sheets 101 and the sticking conditions of the electrically conductive sheets 100 are checked in a process which will be explained later (step 4), and if no inferior position is found (step 5), the sticking method is completed, but if any inferior position is found, a retrying operation is performed (step 6).

Next, a pattern matching process which is the core of the inspection process will be explained with reference FIGS. 6 to 8H.

At first, when an image to be checked is taken into the viewing field S of the camera 61, objects to be checked which will enter the viewing field S, are electrodes 1b (which are large in number, and are laid at narrow pitches), the electrically conductive sheet 100 and the upper protecting sheet 101. The electrodes 1b are observed as a dark image by the camera 61, but the protecting sheet 101 is observed as a white image since the protecting sheet does not transmit light therethrough. Further, the electrically conductive sheet 100 is observed as an image intermediate between the images of the electrodes 1b and the protecting sheet 101 since it is translucent.

Figure 8A:
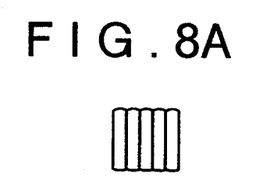
FIG. 8A is an exemplified view illustrating a master pattern used in the sticking apparatus shown in FIG. 1.
Figure 8B:
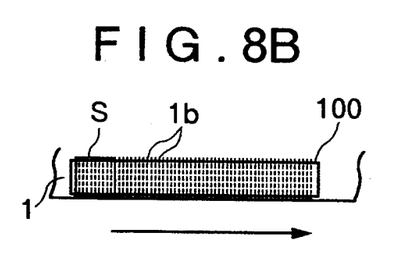
FIG. 8B is a plan view illustrating a display panel used in the sticking apparatus shown in FIG. 1.
Figure 8C:
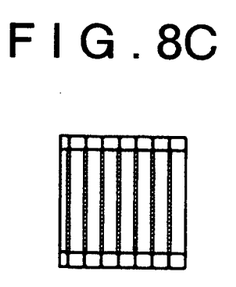
FIG. 8C is an exemplified view illustrating an inspection pattern used in the sticking apparatus shown in FIG. 1.
Figure 8D:
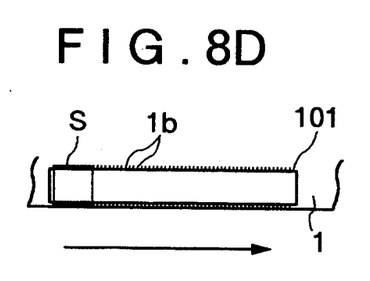
FIG. 8D is a plan view illustrating the display panel used in the sticking apparatus shown in FIG. 1.
Figure 8E:
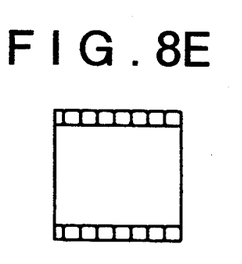
FIG. 8E is an exemplified view illustrating an inspection pattern used in the sticking apparatus shown in FIG. 1.
Figure 8F:
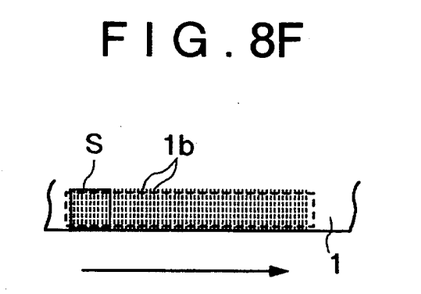
FIG. 8F is a plan view illustrating the display panel used in the sticking apparatus shown in FIG. 1.
Figure 8G:
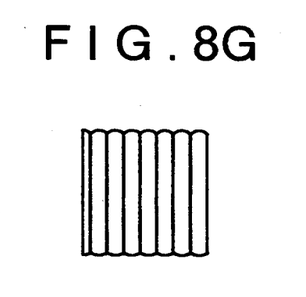
FIG. 8G is an exemplified view illustrating an inspection pattern used in the sticking apparatus shown in FIG. 1.
Figure 8H:
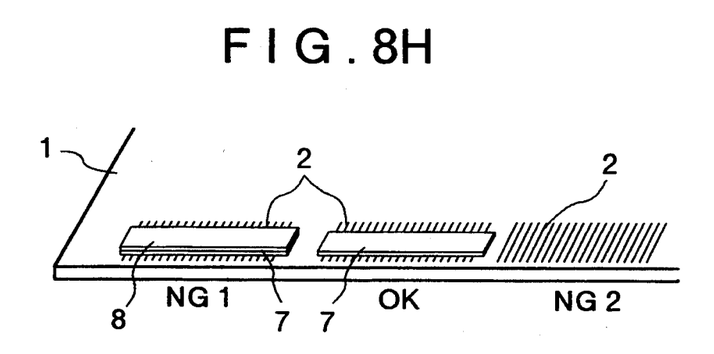
FIG. 8H is a perspective view illustrating various sticking conditions.

FIG. 8b shows a condition such that the electrically conductive sheet 100 is satisfactorily stuck and further the upper protecting sheet 101 is completely peeled off as clearly understood from a part OK of FIG. 8H, and accordingly, an image shown in FIG. 8C can be obtained in the viewing field S under this condition. That is, if only the electrically conductive sheet 100 is stuck over the electrodes 1b, the image of the electrodes 1b is blurred.

Next, FIG. 8D shows a condition such that the protecting sheet 101 fails in being peeled off, as clearly understood from a part NG1 of FIG. 8H, and FIG. 8E shows an image picked up in this case in which the white image of the protecting sheet 100 substantially occupies the viewing field S so that the image is substantially white.

Further, FIG. 8F shows a condition such that the electrically conductive sheet 100 itself fails in being stuck, as clearly understood from a part NG2 of FIG. 8H, and FIG. 8G shows an image picked up in this case in which the dark image of the electrodes 1b is clearly seen in the viewing field S as a whole.

Accordingly, in the pattern matching process, a pattern which is obtained when the image of the electrodes 1b is clearly seen as shown in FIG. 8A is utilized and is stored in the reference pattern memory 63c of the determining part 63. Further, an image (a pattern to be checked) taken into the viewing field S is compared with this master pattern (refer to FIG. 8G) so as to obtain a matching rate.

If the sticking condition is inferior, the pattern (FIG. 8G) to be checked is substantially coincident with the master pattern so that the matching rate become relatively high. If the peel-off condition is inferior, the pattern (FIG. 8E) to be checked is coincident with the master pattern by a substantially half part so that the matching rate becomes about 50%. If the sticking condition is satisfactory, the image of the electrodes 1b is blurred in the pattern (FIG. 8C) to be checked so that the matching rage becomes intermediate between that of the inferior sticking condition and that of the inferior peel-off condition.

In this embodiment, an upper limit value (such as 90%) of the matching rate and a lower limit value (such as 55%) are set, and accordingly, it is determined that a matching rate lower than the lower limit value gives an inferior peel-off condition of the protecting sheet 101 and a matching rate higher than the upper limit value gives an inferior sticking condition of the electrically conductive sheet 100. If the matching rate fails between the values, it is determined that the sticking condition is satisfactory.

Referring to FIGS. 8B, 8D and 8F, the arrows indicate the direction of the peel-off of the protecting sheet, and the viewing field S is set around the peel-off starting position among the electrodes 1b. Empirically, it is likely that inferior sticking or inferior peel-off would occur at the peel-off starting position, and accordingly, the checking can be precisely made in a relatively short time in this way. If the process time can be enough to spare, the matching rates are obtained at several positions or over the entire area in which the electrodes 1b are arranged, and they are averaged.

Further, in the above-mentioned determining method, it is sufficient if the conditions shown in FIGS. 8B, 8D and 8F are determined. In addition to the above-mentioned method, various methods can be used. For example, the height of the sheet from the upper surface of the display panel 1 is measured by means of a sensor with a limited wavelength of light to be detected or a laser radiator, and accordingly, a small height condition (an inferior sticking condition of the electrically conductive sheet 100), a middle height condition (a satisfactory sticking condition) or a large height condition (an inferior peel-off condition of the protecting sheet 101) can be determined in view of the measured height.

Next, the inspection process in the determining method shown in FIGS. 8a to 8H will be explained with reference to FIG. 6. At first, by referring to the positions of the positioning marks 1a obtained at step 1 shown in FIG. 5, the positioning means D is operated so as to set the viewing field S of the camera 60 around the peel-off starting position in the sticking area to be checked (step 41), and an image (a pattern to be checked) is picked up (step 42). Then, the determining means 63 performs the pattern matching between the master pattern (FIG. 8A) and the pattern to be checked (step 43), and calculates the matching rate of the pattern to be checked. Further, the CPU 71 determines a satisfactory sticking condition, an inferior peel-off condition or an inferior sticking condition with the use of the above-mentioned determining method for the pattern to beg checked, and writes check data indicating the result of the check in a predetermined area within the RAM 72 (steps 44 to 49). Further, the above-mentioned steps are repeated until all sticking positions are completely checked (step 50).

Figure 10:
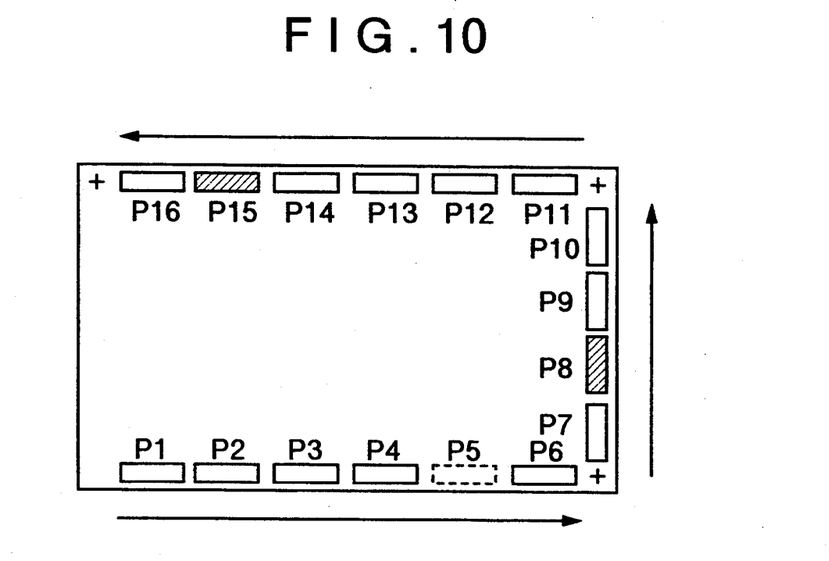
FIG. 10 is a plan view illustrating a display panel used for explanation of the embodiment of the present invention shown in FIG. 1.
Figure 11:
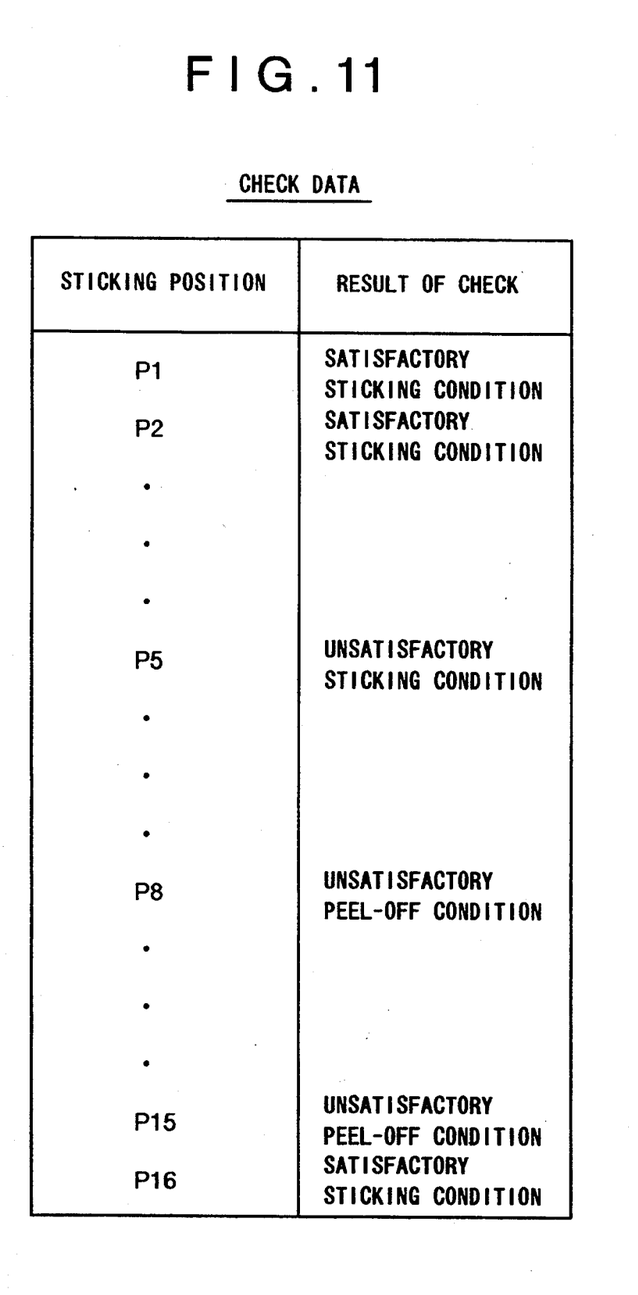
FIG. 11 is a view showing inspection data used in the embodiment of the present invention.

Referring to FIG. 10 which shows an example of the result of the sticking and peel-off operation as shown in FIG. 9, the sticking of the electrically conductive sheet 100 is failed at the position P5 (indicated by the dot lines), and the peel-off of the protecting sheets 101 is failed at positions P8 and P15 (indicated by the hatching). In this case, when the inspection process shown in FIG. 6 is carried out, the check data shown in FIG. 11 can be obtained. Each of the inspection data corresponds to any one of the satisfactory sticking condition, the inferior sticking condition and the inferior sticking condition which are the results of the inspection at the sticking positions P1, P2, . . . P16.

If any one of the inspection data indicates the inferior sticking condition or the inferior peel-off condition, the retrying operation shown in FIG. 7 is carried out. In this retrying operation, the CPU 71 sets at first 1 onto a cycle number counter i for the retrying operation (step 61), and then indexes the sticking position where the sticking condition or the peel-off condition is inferior (step 62). Next, the CPU 71 operates the sheet supply means A, the sticking means B and the positioning means D in order to stick the electrically conductive sheet 100 again onto the inferior sticking position (step 63). In the example shown in FIG. 10, the sticking position P5 is inferior, and accordingly, a new electrically conductive sheet 100 fed from the sheet supply means A is stuck onto to the sticking position P5 by the sticking means B.

Next, the CPU 71 operates the peel-off means C and the positioning means D in order to peel off the protecting sheet 101 remaining on the electrically conductive sheet 100 at the inferior peel-off position and the protecting sheet on the electrically conductive sheet 100 restuck onto the display panel at the inferior sticking position (step 64). In the example shown in FIG. 10, the sticking condition is inferior at the sticking position P5, and accordingly, a new adhesive sheet 100 fed from the sheet supply means A is stuck to the sticking position P5 by means of the sticking means B.

Next, the CPU 71 operates the peel-off means B and the positioning means D in order to peel off the protecting sheet 101 remaining on the electrically conductive sheet 100 at the inferior peel position and the protecting sheet 101 on the newly stuck electrically conductive sheet 100 which is restuck at the inferior sticking position (step 64). In the example shown in FIG. 10, the peel-off operation is carried out at the sticking positions P5, P8 and P15.

Then, the CPU 71 delivers instructions to the determining part 63 and the positioning means D in order to check the sticking conditions at the sticking positions P5, P8 and P15 (step 65). This check is carried out similar to the process shown in FIG. 6. If the result of the check at step 65 exhibits such a condition that no inferior position is present, the retrying operation is completed. However, if any inferior position is still present, the retrying operation is repeated by way of steps 67 an 68. The cycle number of the retrying operation is limited to 5 at maximum. Because the display panel is likely to be damaged since it is extremely fragile and cannot withstand against static electricity caused by friction or the like. Thus, the sticking means B and the peel-off means C are prevented from excessively making contact with the display panel 1. Accordingly, if the cycle number i exceeds 5, the CPU 71 displays an error indication on the CRT 73 and stops the operation of the apparatus.

What is claimed is:

1. A sticking apparatus comprising:
  a supply means for supplying an adhesive sheet composed of a lower sheet having an upper side, which is electrically conductive and adhesive, and an upper sheet applied on the upper side of said lower sheet, for protecting said lower sheet;
  a memory means for storing data of a sticking position on a medium;
  a sticking means for sticking said adhesive sheet on said medium in accordance with the data of a sticking position stored in said memory means;
  a peel-off means for peeling off said upper sheet of the adhesive sheet stuck on said medium by said sticking means;
  a determining means for determining a sticking condition of said adhesive sheet stuck on said medium by said sticking means; and
  a control means for controlling the operation of said sticking means and said peel-off means in accordance with a result of determination by said determining means.

2. A sticking apparatus as set forth in claim 1, wherein said determining means determines a first sticking condition in which said lower sheet is not stuck at the sticking position on said medium, a second sticking condition in which said both upper and lower sheets are not stuck at the sticking position on said medium, and a third condition in which said lower sheet is stuck at the sticking position on said medium.

3. A sticking apparatus as set forth in claim 2, wherein said control means operates said sticking means at a sticking position corresponding to the first sticking condition, and thereafter, operates said peel-off means at sticking positions corresponding to the first and second sticking conditions when said determining means determining the first and second sticking conditions.

4. A sticking apparatus comprising:
  a supply means for supplying an adhesive sheet composed of a lower sheet having an upper side, which is electrically conductive and adhesive, and an upper sheet applied on the upper side of said lower sheet, for protecting said lower sheet;
  a positioning means for positioning a medium;
  a first memory means for storing data of a sticking position on sad medium which has been positioned;
  a sticking means for sticking said adhesive sheet on said medium in accordance with the data of the sticking position stored in said first memory means;
  a peel-off means for peeling off said upper sheet of the adhesive sheet stuck on said medium by said sticking means;
  a second memory means for storing a reference pattern for a sticking condition;
  a determining means for comparing a sticking condition of said adhesive sheet stuck on said medium by said sticking means with the reference pattern stored in said second memory means so as to determine whether the sticking condition is satisfactory or not;
  a control means for controlling the operation of said sticking means and said peel-off means in accordance with a result of determination by said determining means.

5. A sticking apparatus as set forth in claim 4, wherein said determining means determines a first sticking condition in which said lower sheet is not stuck at the sticking position on said medium, a second sticking condition in which said both upper and lower sheets are not stuck at the sticking position on said medium, and a third condition in which said lower sheet is stuck at the sticking position on said medium.

6. A sticking apparatus as set forth in claim 5, wherein said control means operates said sticking means at a sticking position corresponding to the first sticking condition, and thereafter, operates said peel-off means at sticking positions corresponding to the first and second sticking conditions when said determining means determining the first and second sticking conditions.

7. A sticking method of sticking an adhesive sheet composed of a lower sheet having an upper side, which is electrically conductive and adhesive, and an upper sheet applied on said upper side of said lower sheet, for protecting said lower sheet; onto a medium, comprising the steps of:
  positioning said medium at a predetermined position;

sticking said adhesive sheet at a sticking position on said medium which has been positioned;

peeling off said upper sheet of said adhesive sheet stuck on said medium, determining a first sticking condition in which said lower sheet is not stuck at the sticking position, a second condition in which said both upper and lower sheets are not stuck at the sticking position on said medium, and a third sticking condition in which said lower sheet is stuck at the sticking position on said medium; and sticking said adhesive sheet at a sticking position corresponding to said first sticking condition, and thereafter, peeling-off said upper sheets at sticking positions corresponding to said first and second sticking conditions.

8. A sticking method as set forth in claim 7, wherein said determining step carries out determination by comparing a sticking condition of said adhesive sheet with a reference pattern.

* * * * *